(12) United States Patent
Mok et al.

(10) Patent No.: US 12,741,448 B2
(45) Date of Patent: Sep. 22, 2026

(54) ENCAPSULATION FILM

(71) Applicant: LG CHEM, LTD., Seoul (KR)

(72) Inventors: Yeong Bong Mok, Daejeon (KR); Seung Min Lee, Daejeon (KR); Sang Min Park, Daejeon (KR); Sung Nam Moon, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 688 days.

(21) Appl. No.: 17/769,675

(22) PCT Filed: Oct. 28, 2020

(86) PCT No.: PCT/KR2020/014802
§ 371 (c)(1),
(2) Date: Apr. 15, 2022

(87) PCT Pub. No.: WO2021/086007
PCT Pub. Date: May 6, 2021

(65) Prior Publication Data

US 2022/0393139 A1 Dec. 8, 2022

(30) Foreign Application Priority Data

Oct. 28, 2019 (KR) ........................ 10-2019-0134808

(51) Int. Cl.
*H10K 50/844* (2023.01)
*B32B 15/06* (2006.01)
(Continued)

(52) U.S. Cl.
CPC .............. *B32B 15/06* (2013.01); *B32B 27/18* (2013.01); *H10K 50/844* (2023.02);
(Continued)

(58) Field of Classification Search
CPC .. H10K 50/846; H10K 59/874; H10K 50/844; B32B 2457/206;
(Continued)

(56) References Cited

U.S. PATENT DOCUMENTS

2004/0048033 A1 3/2004 Klausmann et al.
2011/0132449 A1* 6/2011 Ramadas ............ H10K 59/871 428/419
(Continued)

FOREIGN PATENT DOCUMENTS

CN 106415875 A 2/2017
CN 108110028 A 6/2018
(Continued)

OTHER PUBLICATIONS

Machine translation of KR20150010557A, published Jan. 2015, Powered by EPO and Google. (Year: 2015).*
(Continued)

*Primary Examiner* — Monique R Jackson
(74) *Attorney, Agent, or Firm* — Bryan Cave Leighton Paisner LLP

(57) ABSTRACT

An encapsulation film, a method for manufacturing the same, an organic electronic device comprising the same, and a method for manufacturing the organic electronic device using the same are provided, where the encapsulation film allows forming a structure capable of blocking moisture or oxygen penetrating into an organic electronic device from outside and prevents generation of bright spots in the organic electronic device.

16 Claims, 1 Drawing Sheet

(51) Int. Cl.

| | |
|---|---|
| ***B32B 27/18*** | (2006.01) |
| ***H10K 50/84*** | (2023.01) |
| *B32B 15/08* | (2006.01) |
| *B32B 17/10* | (2006.01) |

(52) U.S. Cl.
CPC ............ *H10K 50/846* (2023.02); *B32B 15/08* (2013.01); *B32B 17/10* (2013.01); *B32B 2255/06* (2013.01); *B32B 2255/205* (2013.01); *B32B 2255/26* (2013.01); *B32B 2255/28* (2013.01); *B32B 2264/102* (2013.01); *B32B 2264/1055* (2020.08); *B32B 2307/7244* (2013.01); *B32B 2307/7246* (2013.01); *B32B 2457/00* (2013.01); *B32B 2457/206* (2013.01); *H10K 50/841* (2023.02)

(58) Field of Classification Search
CPC .... B32B 2264/1055; C08K 2003/0862; C08K 2003/2206; C08K 2003/2224
See application file for complete search history.

(56) References Cited

U.S. PATENT DOCUMENTS

| | | | | |
|---|---|---|---|---|
| 2014/0287543 | A1 | 9/2014 | Son et al. | |
| 2017/0222183 | A1 | 8/2017 | Cho et al. | |
| 2017/0373320 | A1* | 12/2017 | Choi | H01M 10/052 |
| 2020/0091460 | A1* | 3/2020 | Yoo | H10K 50/87 |
| 2020/0127230 | A1* | 4/2020 | Moon | H10K 50/844 |

FOREIGN PATENT DOCUMENTS

| | | | | |
|---|---|---|---|---|
| JP | 2014-203707 | A | | 10/2014 |
| JP | 2016-027639 | A | | 2/2016 |
| JP | 2016-89097 | A | | 5/2016 |
| KR | 10-2006-0023652 | A | | 3/2006 |
| KR | 20150010557 | A | * | 1/2015 |
| KR | 10-2015-0059196 | A | | 6/2015 |
| KR | 10-2018-0059035 | A | | 6/2018 |
| KR | 10-2018-0134774 | A | | 12/2018 |
| KR | 10-2018-0134775 | A | | 12/2018 |
| KR | 10-2018-0134776 | A | | 12/2018 |
| KR | 10-2019-0034957 | A | | 4/2019 |
| KR | 10-2019-0072892 | A | | 6/2019 |
| TW | 430885 | B | | 3/2014 |
| WO | 2009-126115 | A1 | | 10/2009 |
| WO | 2018226077 | A1 | | 12/2018 |
| WO | 2018226078 | A1 | | 12/2018 |

OTHER PUBLICATIONS

Wikipedia.org, "Normal distribution", Retrieved from <https://en.wikipedia.org/w/index.php?title=Normal_distribution&oldid=1297477663> on Jun. 30, 2025. (Year: 2025).*

Encyclopaedia Brittanica, "normal distribution", 2019, Retrieved from <https://academic.eb.com/levels/collegiate/article/normal-distribution/56135> on Jun. 30, 2025. (Year: 2019).*

Leschonski, Particle Size Analysis and Characterization of a Classification Process, in Ullmann's Encyclopedia of Industrial Chemistry, 2005, Wiley-VCH Verlag Gmbh & Co. KGaA, Weinheim, pp. 1-35. (Year: 2005).*

* cited by examiner

ENCAPSULATION FILM

CROSS-REFERENCE TO RELATED APPLICATIONS

The present application is a National Phase Entry pursuant to 35 U.S.C. § 371 of International Application No. PCT/KR2020/014802 filed Oct. 28, 2020 and claims priority to and the benefit of priority based on Korean Patent Application No. 10-2019-0134808 filed on Oct. 28, 2019, the disclosures of which are incorporated herein by reference in their entirety.

FIELD OF DISCLOSURE

The present application relates to an encapsulation film, an organic electronic device comprising the same, and a method for manufacturing the organic electronic device.

BACKGROUND

An organic electronic device (OED) is a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields of portable devices, monitors, notebooks, and TVs.

In commercialization and expanded application of the OLED, the most important problem is a durability. Organic materials and metal electrodes, and the like included in the OLED are very easily oxidized by external factors such as moisture. In addition, there is also a problem that bright spots of the OLED are caused by the outgas that may be generated inside the OLED device. That is, products comprising OLEDs are very sensitive to environmental factors. Accordingly, various methods have been proposed in order to suppress the outgas generated inside, while effectively blocking penetration of oxygen or moisture from outside into an organic electronic device such as OLED.

SUMMARY

The present application provides an encapsulation film that allows forming a structure capable of blocking moisture or oxygen penetrating into an organic electronic device from outside and prevents generation of bright spots in the organic electronic device.

The present application relates to an encapsulation film. The encapsulation film can be applied to sealing or encapsulating an organic electronic device such as, for example, OLEDs.

In this specification, the term "organic electronic device" means an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one embodiment of the present application, the organic electronic device may be an OLED.

An exemplary organic electronic element encapsulation film may comprise an encapsulation layer. The encapsulation layer may encapsulate the entire surface of an organic electronic element formed on a substrate. In one embodiment, the encapsulation layer may include a moisture adsorbent, a bright spot inhibitor, and an encapsulation resin. Also, in the present application, as a result of analyzing particle size of the moisture adsorbent and the bright spot inhibitor contained in a sample prepared by dissolving the encapsulation layer in an organic solvent to form a solution and then filtering the solution through a 300-mesh nylon filter, a value according to the following general formula 1 can satisfy the range of 2.4 to 3.6. That is, to provide the sample, the encapsulation layer is dissolved in an organic solvent first, and thereafter, the solution of dissolved encapsulation layer composition is filtered through a 300-mesh nylon filter and the filtrate therefrom is sampled. The particle size analysis is performed on the moisture adsorbent and the bright spot inhibitor included in the sample. As a result of particle size analysis, D10, D50 and D90 are calculated and put into the following general formula 1. The lower limit of the value calculated according to the following general formula 1 may be, for example, 2.4, 2.5, 2.6, 2.7, 2.75, 2.8, 2.85, 2.9, 2.95, 3.0, 3.05, 3.1, 3.15 or 3.17 or more, and the upper limit may be, for example, 3.6, 3.5, 3.4, 3.3, 3.28, 3.25, 3.2, 3.0, 2.95, 2.9, 2.85, or 2.8 or less.

$$\sqrt{1.8\times D50+\frac{D50}{D10}+\frac{D90}{D50}} \quad \text{[General Formula 1]}$$

In General Formula 1 above, D10 is an average particle diameter according to particle size analysis result D10, D50 is an average particle diameter according to particle size analysis result D50, and D90 is an average particle diameter according to particle size analysis result D90. The unit is μm. The particle size analysis may be a particle size distribution measured according to ISO13320:2009. The definitions of D10, D50 and D90 are the same as defined in particle size analysis. As a result of particle size analysis, D10, D50 and D90 may mean sizes corresponding to 10%, 50% and 90%, respectively, with respect to the maximum value in the cumulative distribution of particle sizes. Conventionally, the size of the particles included in the encapsulation layer was simply controlled through only the average particle diameter, but the present application adjusts an absolute value of D50, which is a particle diameter corresponding to the volume accumulation 50% in the cumulative distribution of particles, and an appropriate ratio between particles having a small particle size and particles having a large particle size. From the above, the present application can prevent bright spots through hydrogen adsorption while implementing moisture barrier properties, and also realize long-term endurance reliability of an organic electronic device even in a harsh environment as curing properties are not deteriorated.

In one embodiment, the ratio of the average particle diameter according to D50 to the average particle diameter according to the particle size analysis result D10 of the moisture adsorbent and the bright spot inhibitor may be in a range of 2.0 to 4.0. The lower limit of the ratio may be, for example, 2.1, 2.2, 2.3, 2.4, 2.5, 2.6, or 2.7 or more, and the upper limit may be, for example, 4.0, 3.9, 3.8, 3.7, 3.6, 3.5, 3.4, 3.3, 3.2, 3.1, 3.0, 2.95 or 2.93.

In one embodiment, the type of the organic solvent is not particularly limited, but may be, for example, toluene, and the sample may be one measured for a sample cut into, for example, 1.5 cm×1.5 cm. In addition, in this specification, the unit mesh may be a unit of American ASTM standard. When the encapsulation layer is attached to a glass substrate and/or a metal layer, the encapsulation layer may be separated from the metal layer by decapsulating it from the glass substrate and then immersing it in liquid nitrogen, where the method of decapsulating is not limited thereto, and a known method may be used. The present application may quantitatively calculate the particle diameter distribution through the particle size analysis. In addition, the filtration of the encapsulation layer through the filtering is to remove impurity particles such as dust introduced during the re-dissolution process.

In one embodiment, the ratio of the average particle diameter of the bright spot inhibitor to the average particle diameter of the moisture adsorbent according to the D50 particle size analysis may be 2.0 or less. The lower limit of the particle diameter ratio may be 0.01, 0.1, 0.15, 0.18, 0.2, 0.23, 0.25, 0.3, 0.5, 0.6, 0.7, 0.8, 0.9, 1.0 or 1.1 or more, and the upper limit may be 1.9, 1.8, 1.7, 1.6, 1.5, 1.4, 1.3, 1.2, 1.1, 1.0, 0.9, 0.8, 0.7, 0.6, 0.5, 0.4 or 0.3 or less. The original purpose of the encapsulation film of the present application was intended to block moisture from the outside, where in order to solve the other technical problem of hydrogen adsorption, the bright spot inhibitor was newly introduced, but there was a technical problem that it was not easy to maintain the original moisture barrier effect while comprising the bright spot inhibitor. The present application implements excellent bright spot prevention performance while maintaining the original moisture barrier effect by adjusting the particle size distribution and/or the particle diameter ratio of the moisture adsorbent and the bright spot inhibitor.

In this specification, the term “moisture adsorbent” may mean a chemically reactive adsorbent capable of removing moisture or humidity, for example, through chemical reaction with the moisture or humidity that has penetrated the encapsulation film, as described below.

For example, the moisture adsorbent may be present in an evenly dispersed state in the encapsulation layer or the encapsulation film. Here, the evenly dispersed state may mean a state where the moisture adsorbent is present at the same or substantially the same density even in any portion of the encapsulation layer or the encapsulation film. The moisture adsorbent that can be used in the above may include, for example, a metal oxide, a sulfate or an organometallic oxide, and the like. Specifically, an example of the sulfate may include magnesium sulfate, sodium sulfate or nickel sulfate, and the like, and an example of the organometallic oxide may include aluminum oxide octylate and the like. Here, a specific example of the metal oxide may include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be included in the encapsulation layer, one or two or more of the above-mentioned constitutions may be also used. In one embodiment, when two or more are used as the moisture adsorbent, calcined dolomite and the like may be used.

Such a moisture adsorbent may be controlled to an appropriate size depending on the application. In one embodiment, the average particle diameter of the moisture adsorbent may be controlled to 100 to 15000 nm, 500 nm to 10000 nm, 800 nm to 8000 nm, 1 μm to 7 μm, 1.5 μm to 5 μm or 1.8 μm to 3 μm. The moisture adsorbent having a size in the above range is easy to store because the reaction rate with moisture is not too fast, does not damage the element to be encapsulated, and can effectively remove moisture without interfering with the hydrogen adsorption process in relation to the above-described bright spot inhibitor. In this specification, the particle diameter may mean an average particle diameter, and may be one measured by a known method with a D50 particle size analyzer, unless otherwise specified.

The content of the moisture adsorbent is not particularly limited, which may be suitably selected in consideration of the desired blocking characteristics. In one embodiment, the encapsulation film of the present application may have a weight ratio of the bright spot inhibitor to the moisture adsorbent in a range of 0.001 to 0.5 or 0.01 to 0.1. In the present application, the bright spot inhibitor is dispersed in the film to prevent bright spots, but the bright spot inhibitor added to prevent the bright spots may be included in a specific content ratio with the moisture adsorbent, considering implementation of moisture barrier properties and reliability of the element, which is the original function of the encapsulation film.

As described above, the encapsulation layer of the present application may comprise a bright spot inhibitor. The bright spot inhibitor may have an adsorption energy of 0 eV or less for outgases, as calculated by an approximation method of the density functional theory. The lower limit of the adsorption energy is not particularly limited, but may be −20 eV. The type of the outgas is not particularly limited, but may include oxygen, H atoms, $H_2$ molecules and/or $NH_3$. As the encapsulation film comprises the bright spot inhibitor, the present application can prevent bright spots due to the outgas generated in the organic electronic device.

In an embodiment of the present application, the adsorption energy between the bright spot inhibitor and the bright spot-causing atoms or molecules can be calculated through electronic structure calculation based on the density functional theory. The above calculation can be performed by a method known in the art. For example, in the present application, after making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/Å or less. A series of calculation was performed through VASP as a commercially available code.

The material of the bright spot inhibitor is not limited as long as the material is a material having the effect of preventing the bright spots on the panel of the organic electronic device when the encapsulation film is applied to the organic electronic device. For example, the bright spot inhibitor may be a material capable of adsorbing a material exemplified by, for example, oxygen, $H_2$ gas, ammonia ($NH_3$) gas, $H^+$, $NH^{2+}$, $NHR_2$ or $NH_2R$ as outgas generated from an inorganic deposition layer of silicon oxide, silicon nitride, or silicon oxynitride deposited on an electrode of an organic electronic element. Here, R may be an organic group, and for example, may be exemplified by an alkyl group, an alkenyl group, an alkynyl group and the like, but is not limited thereto.

In one embodiment, the material of the bright spot inhibitor is not limited as long as it satisfies the above adsorption energy value, which may be a metal or a non-metal. The bright spot inhibitor may comprise, for example, Li, Ni, Ti, Rb, Be, Mg, Ca, Sr, Ba, Al, Zn, In, Pt, Pd, Fe, Cr, Si, or a formulation thereof, may comprise an oxide or a nitride of the material, and may comprise an alloy of the material. In one embodiment, the bright spot inhibitor may comprise nickel particles, nickel oxide particles, titanium nitride, titanium-based alloy particles of iron-titanium, manganese-based alloy particles of iron-manganese, magnesium-based alloy particles of magnesium-nickel, rare earth-based alloy particles, zeolite particles, silica particles, carbon nanotubes, graphite, aluminophosphate molecular sieve particles or meso silica particles. The bright spot inhibitor may be included in an amount of 1 to 150 parts by weight, 1.5 to 100 parts by weight, 2 to 80 parts by weight, 2.5 to 50 parts by weight, 3 to 40 parts by weight, 3.5 parts by weight to 20 parts by weight, 4 parts by weight to 10 parts by weight, or 4.5 parts by weight to 8 parts by weight, relative to 100 parts by weight of the encapsulation resin. The present application can realize the bright spot prevention of the organic electronic device while improving adhesiveness and durability of the film in the above content range. In addition, the bright spot inhibitor may have a particle diameter in a range of 10 nm to 30 μm, 50 nm to 21 μm, 105 nm to 18 μm, 110 nm to 12 μm, 120 nm to 9 μm, 140 nm to 4 μm, 150 nm to 2 μm, 180 nm to 900 nm, 230 nm to 700 nm or 270 nm to 550 nm. The particle size may be according to D50 particle size analysis. By comprising the bright spot inhibitor, the present application can realize moisture barrier properties and endurance reliability of the encapsulation film together while efficiently adsorbing hydrogen generated in the organic electronic device. In this specification, the term resin component may be an encapsulation resin and/or a binder resin, which are described below.

In one embodiment, when the surface or cross-section of the encapsulation layer in the present application is confirmed with a backscattered electron image at an acceleration voltage of 15 kV through scanning electron microscope (SEM), the moisture adsorbent and bright spot inhibitor having a particle diameter of 100 nm to 20 μm may be in a range of 10% or more, 15% or more, or 20% or more of the area of the entire surface or cross-section. The upper limit may be 95% or less, 80% or less, 70% or less, or 50% or less. In addition, when the surface or cross-section of the encapsulation layer in the present application is confirmed with a backscattered electron image at an acceleration voltage of 15 kV through SEM, the area occupied by the bright spot inhibitor may be smaller than the area occupied by the moisture adsorbent. By adjusting the area ratio of the backscattered electron image, the present application cannot only realize the moisture barrier effect and the bright spot prevention effect, but also allow the light to sufficiently reach the resin matrix upon UV curing, thereby implementing curing characteristics and endurance reliability at high temperature and high humidity. The area ratio may be adjusted according to the cumulative particle size distribution, particle diameter size, or particle diameter ratio of the aforementioned moisture adsorbent and bright spot inhibitor.

In one embodiment, the encapsulation layer of the present application may have a multilayer structure comprising at least two or more encapsulation layers as a single layer. In the case of comprising the two or more encapsulation layers, the encapsulation layer may comprise a first layer facing the organic electronic element when the element is encapsulated, and a second layer located on the surface opposite to the surface of the first layer facing the element. In one embodiment, as shown in FIG. 1A, the encapsulation film comprises at least two or more encapsulation layers, where the encapsulation layer may comprise the first layer (2) facing the organic electronic element upon encapsulation and the second layer (4) not facing the organic electronic element. In addition, the second layer (4) may comprise the bright spot inhibitor (3) having an adsorption energy of 0 eV or less for outgases, as calculated by an approximation method of the density functional theory. In addition, the encapsulation film of the present application comprises the bright spot inhibitor in the second layer located on the surface opposite to the element attachment surface of the first layer facing the organic electronic element upon encapsulation, whereby the damage to the organic electronic element according to the concentration of stress due to the bright spot inhibitor can be prevented. From such a point of view, the first layer may or may not comprise the bright spot inhibitor in 15% or less based on the mass of the entire bright spot inhibitor in the encapsulation film. In addition, the layer that does not contact the organic electronic element except for the first layer may comprise 85% or more of the bright spot inhibitor based on the mass of the entire bright spot inhibitor in the encapsulation film. That is, in the present application, upon element encapsulation, the other encapsulation layer that does not contact the organic electronic element may contain a larger amount of the bright spot inhibitor compared to the first layer facing the organic electronic element, whereby it is possible to prevent physical damage to be applied to the element, while implementing moisture barrier properties and bright spot prevention characteristics of the film.

As described above, the encapsulation layer may have a multilayer structure of two or more. When two or more layers constitute the encapsulation layer, the compositions of the respective layers in the encapsulation layer may be the same or different. In one embodiment, the encapsulation layer may comprise an encapsulation resin and/or a moisture adsorbent, and the encapsulation layer may be a pressure-sensitive adhesive layer or an adhesive layer.

As shown in FIGS. 1A and 1B, the encapsulation layer (2, 4) may comprise a first layer (2) and a second layer (4), and the second layer (4) of the encapsulation layer may comprise a bright spot inhibitor (3). Also, as shown in FIG. 1B, the second layer may comprise a bright spot inhibitor (3) and a moisture adsorbent (5) together. Furthermore, without being limited to the above, the encapsulation layer may be formed in a three-layer structure. In the encapsulation film of the present application, when the encapsulation layer has a three-layer structure, at least one encapsulation layer may comprise a bright spot inhibitor and/or a moisture adsorbent. For example, the bright spot inhibitor and the moisture adsorbent may also be included together in one encapsulation layer or may each be present in separate encapsulation layers. However, when the encapsulation film is applied on the organic electronic element, the first layer (2), which is the encapsulation layer facing the organic electronic element, may not comprise the bright spot inhibitor and the moisture adsorbent, or may comprise a small amount even if they are included.

In an embodiment of the present disclosure, the encapsulation layer may comprise an encapsulation resin, and the encapsulation resin may be a curable resin or a crosslinkable resin. The encapsulation resin may have a glass transition temperature of less than 0° C., less than −10° C. or less than −30° C., less than −50° C. or less than −60° C. The lower limit is not particularly limited, which may be −150° C. or higher. Here, the glass transition temperature may be a glass transition temperature after curing, and in one embodiment, it may mean a glass transition temperature after irradiating it with ultraviolet rays having an irradiance level of about 1 $J/cm^2$ or more; or a glass transition temperature after the ultraviolet irradiation and then further performing thermosetting.

In one embodiment, the encapsulation resin may comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high-density polyethylene resin or elastomer, a low-density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth)acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above may be also used, for example, by being grafted with maleic anhydride or the like, by being copolymerized with other resins or elastomers through monomers for producing resins or elastomers, and by being modified with other compounds. An example of other compounds above may include carboxyl-terminal butadiene-acrylonitrile copolymers and the like.

In one embodiment, the encapsulation layer may comprise, but is not limited to, the olefin elastomer, the silicone elastomer or the acrylic elastomer, and the like among the above-mentioned types as the encapsulation resin.

In one embodiment of the present disclosure, the encapsulation resin may be an olefin-based resin. In one embodiment, the olefin-based resin may be a homopolymer of a butylene monomer; a copolymer obtained by copolymerizing a butylene monomer and another polymerizable monomer; a reactive oligomer using a butylene monomer; or a mixture thereof. The butylene monomer may include, for example, 1-butene, 2-butene or isobutylene.

Other monomers polymerizable with the butylene monomers or derivatives may include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer may comprise a butylene polymer having a reactive functional group. The oligomer may have a weight average molecular weight ranging from 500 to 5000. Furthermore, the butylene polymer may be coupled to another polymer having a reactive functional group. The other polymer may be, but is not limited to, alkyl (meth)acrylate. The reactive functional group may be a hydroxyl group, a carboxyl group, an isocyanate group or a nitrogen-containing group. Also, the reactive oligomer and the other polymer may be cross-linked by a multifunctional cross-linking agent, and the multifunctional cross-linking agent may be at least one selected from the group consisting of an isocyanate cross-linking agent, an epoxy cross-linking agent, an aziridine cross-linking agent and a metal chelate cross-linking agent.

In one embodiment, the encapsulation resin of the present application may be a copolymer of a diene and an olefinic compound containing one carbon-carbon double bond. Here, the olefinic compound may include butylene or the like, and the diene may be a monomer capable of polymerizing with the olefinic compound, and may include, for example, isoprene or butadiene and the like. For example, the copolymer of an olefinic compound containing one carbon-carbon double bond and a diene may be a butyl rubber.

In the encapsulation layer, the resin or elastomer component may have a weight average molecular weight (Mw) to an extent such that the pressure-sensitive adhesive composition can be formed into a film shape. For example, the resin or elastomer may have a weight average molecular weight of about 100,000 to 2,000,000 g/mol, 120,000 to 1,500,000 g/mol, or 150,000 to 1,000,000 g/mol or so. In this specification, the term weight average molecular weight means a value converted to standard polystyrene measured by GPC (gel permeation chromatograph). However, the resin or elastomer does not necessarily have the above-mentioned weight average molecular weight. For example, in the case where the molecular weight of the resin or elastomer component is not in a level enough to form a film, a separate binder resin may be blended into the pressure-sensitive adhesive composition.

In another embodiment, the encapsulation resin according to the present application may be a curable resin. When the encapsulation resin is a curable resin, the encapsulation resin may be a resin having a glass transition temperature of 85° C. or more and 200° C. or less after curing. The glass transition temperature may be a glass transition temperature after photo-curing or thermosetting the encapsulation resin. The specific kind of the usable curable resin in the present disclosure is not particularly limited, and for example, various thermosetting or photo-curable resins known in this field can be used. The term "thermosetting resin" means a resin that can be cured through an appropriate heat application or aging process, and the term "photo-curable resin" means a resin that can be cured by irradiation with electromagnetic waves. Furthermore, the curable resin may be a dual curing resin including both of heat curing properties and light curing properties.

The specific kind of the curable resin in the present application is not particularly limited as long as it has the above-mentioned characteristics. For example, it may be cured to exhibit an adhesive property, which may include a resin containing one or more thermosetting functional groups such as a glycidyl group, an isocyanate group, a hydroxyl group, a carboxyl group or an amide group, or containing one or more functional groups curable by irradiation with electromagnetic waves, such as an epoxide group, a cyclic ether group, a sulfide group, an acetal group or a lactone group. A specific example of such a resin may include an acrylic resin, a polyester resin, an isocyanate resin or an epoxy resin, and the like, but is not limited thereto.

In the present application, as the curable resin, aromatic or aliphatic; or linear or branched epoxy resins may be used. In one embodiment of the present disclosure, an epoxy resin having an epoxy equivalent of 180 g/eq to 1,000 g/eq, which contains two or more functional groups, may be used. By using the epoxy resin having an epoxy equivalent in the above range, characteristics such as adhesion performance and glass transition temperature of the cured product can be effectively maintained. An example of such an epoxy resin may include one or a mixture of two or more of a cresol novolak epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the present application, as the curable resin, an epoxy resin comprising a cyclic structure in a molecular structure can be used, and an epoxy resin comprising an aromatic group (for example, a phenyl group) can be used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin that can be used in the present disclosure may be one or a mixture of two or more of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin and the like, but is not limited thereto.

In addition, in one embodiment, the encapsulation layer of the present application may comprise an active energy ray polymerizable compound which is highly compatible with the encapsulation resin and can form a specific cross-linked structure together with the encapsulation resin. In this case, the encapsulation resin may be a cross-linkable resin.

For example, the encapsulation layer of the present application may comprise a multifunctional or monofunctional active energy ray-polymerizable compound that can be polymerized by irradiation of an active energy ray together with the encapsulation resin. The active energy ray polymerizable compound may mean a compound comprising two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) may be used.

Also, the multifunctional active energy ray polymerizable compound may be included in an amount of 3 parts by weight to 30 parts by weight, 5 parts by weight to 25 parts by weight, 8 parts by weight to 20 parts by weight, 10 parts by weight to 18 parts by weight or 12 parts by weight to 18 parts by weight, relative to 100 parts by weight of the encapsulation resin. In the case of the monofunctional active energy ray polymerizable compound, it may also be separately included in the content range as above. The present application provides an encapsulation film having excellent endurance reliability even under severe conditions such as high temperature and high humidity in the above range.

The multifunctional active energy ray polymerizable compound which can be polymerized by irradiation of the active energy ray can be used without any limitation. For example, the compound may include 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-diol di(meth)acrylate, tricyclodecanedimethanol (meth)diacrylate, dimethyloldicyclopentane di(meth)acrylate, neopentylglycol-modified trimethylol propane di(meth) acrylate, admantane di(meth)acrylate, trimethylolpropane tri(meth)acrylate, or a mixture thereof.

As the multifunctional active energy ray polymerizable compound, for example, a compound having a molecular weight of 100 or more and less than 1,000 g/mol and containing two or more functional groups may be used. As the monofunctional active energy ray polymerizable compound, for example, a compound having a molecular weight of 100 or more and less than 1,000 g/mol and containing one functional group may be used. In this case, the molecular weight may mean a weight average molecular weight (GPC measurement) or a typical molecular weight. The ring structure included in the multifunctional active energy ray polymerizable compound may be any one of a carbocyclic structure or a heterocyclic structure; or a monocyclic or polycyclic structure.

In an embodiment of the present application, the encapsulation layer may further comprise a radical initiator. The radical initiator may be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The radical initiator may be included in a ratio of 0.2 parts by weight to 20 parts by weight, 0.5 to 18 parts by weight, 1 to 15 parts by weight, or 2 parts by weight to 13 parts by weight, relative to 100 parts by weight of the active energy ray polymerizable compound. As a result, the reaction of the active energy ray polymerizable compound can be effectively induced and deterioration of the physical properties of the encapsulation layer composition due to the residual components after curing can be also prevented.

In a specific example of the present application, the encapsulation layer of the encapsulation film may further comprise a curing agent, depending on the type of the included resin component. For example, it may further comprise a curing agent capable of reacting with the above-mentioned encapsulation resin to form a cross-linked structure or the like. In this specification, the terms encapsulation resin and/or binder resin may be used in the same sense as the resin component.

The kind of the curing agent may be appropriately selected and used depending on the type of the resin component or the functional group contained in the resin.

In one embodiment, when the resin component is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one embodiment, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the encapsulation resin. For example, the curing agent may be included in an amount of 1 part by weight to 20 parts by weight, 1 part by weight to 10 parts by weight or 1 part by weight to 5 parts by weight, relative to 100 parts by weight of the resin component. However, the weight ratio can be changed depending on the type and ratio of the encapsulation resin or the functional group of the resin, or the cross-linking density to be implemented, and the like.

When the resin component is a resin which can be cured by irradiation of the active energy ray, for example, a cationic photopolymerization initiator may be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one embodiment, as the cationic initiator, an ionized cationic photopolymerization initiator may be used.

In one embodiment, the encapsulation layer may further comprise a tackifier, where the tackifier may be, preferably, a hydrogenated cyclic olefin polymer. As the tackifier, for example, a hydrogenated petroleum resin obtained by hydrogenating a petroleum resin can be used. The hydrogenated petroleum resin may be partially or fully hydrogenated and may be also a mixture of such resins. Such a tackifier can be selected to have good compatibility with the pressure-sensitive adhesive composition, excellent moisture barrier property, and low organic volatile components. A specific example of the hydrogenated petroleum resin may include a hydrogenated terpene resin, a hydrogenated ester resin or a hydrogenated dicyclopentadiene resin, and the like. The tackifier may have a weight average molecular weight of about 200 to 5,000 g/mol. The content of the tackifier can be appropriately adjusted as necessary. For example, according to one example, the content of the tackifier may be included in a ratio of 5 parts by weight to 100 parts by weight, 8 to 95 parts by weight, 10 parts by weight to 93 parts by weight or 15 parts by weight to 90 parts by weight, relative to 100 parts by weight of the encapsulation resin.

The encapsulation layer may also comprise a moisture blocker, if desired. In this specification, the term "moisture blocker" may mean a material which has free or low reactivity with moisture, but can physically block or hinder movement of moisture or humidity within the film. As the moisture blocker, for example, one or two or more of clay, talc, spherical silica, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The content of the moisture blocker is not particularly limited and may be suitably selected in consideration of the desired blocking characteristics.

In addition to the above-described constitutions, the encapsulation layer may comprise various additives depending on applications and the manufacturing process of the encapsulation film to be described below. For example, the encapsulation layer may comprise a curable material, a cross-linking agent, a filler or the like in an appropriate range of content depending on the intended physical properties.

When the encapsulation layer is formed of two or more layers, the second layer that does not contact the organic electronic element may comprise the moisture adsorbent. For example, when it is formed of two or more layers, the layer in contact with the organic electronic element among the encapsulation layer may comprise no moisture adsorbent, or comprise the moisture adsorbent in a small amount of less than 5 parts by weight or less than 4 parts by weight relative to 100 parts by weight of the encapsulation resin.

Specifically, considering that the encapsulation film is applied to encapsulation of an organic electronic element, the content of the moisture adsorbent can be controlled in consideration of the damage of the element. For example, the first layer facing the element upon encapsulation may be comprised of a small amount of a moisture adsorbent, or comprise no moisture adsorbent. In one embodiment, the first layer of the encapsulation layer facing the element upon encapsulation may comprise 0 to 20% of a moisture adsorbent relative to the total mass of the moisture adsorbent contained in the encapsulation film. In addition, the encapsulation layer that does not contact the element may comprise 80 to 100% of a moisture adsorbent relative to the total mass of the moisture adsorbent contained in the encapsulation film.

In a specific example of the present application, the encapsulation film may further comprise a metal layer formed on one surface of the encapsulation layer. The metal layer of the present application may have thermal conductivity of 15 W/m·K or more, 18 W/m·K or more, 20 W/m·K or more, 25 W/m·K or more, 30 W/m·K or more, 40 W/m K or more, 50 W/m K or more, 60 W/m K or more, 70 W/m K or more, 80 W/m K or more, 90 W/m K or more, 100 W/m K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which may be 800 W/m·K or less. By having such high thermal conductivity, the heat generated at the bonding interface upon the metal layer bonding process can be released more quickly. Also, the heat accumulated during the operation of the organic electronic device is rapidly released because of the high thermal conductivity, whereby the temperature of the organic electronic device itself can be kept lower, and the occurrence of cracks and defects is reduced. The thermal conductivity may be measured at any temperature in the temperature range of 15 to 30° C.

The term "thermal conductivity" herein is a degree representing capability in which a material is capable of transferring heat by conduction, where the unit may be expressed by W/m·K. The unit represents the degree to which the material transfers heat at the same temperature and distance, which means a unit of heat (watt) to a unit of distance (meter) and a unit of temperature (kelvin).

In an embodiment of the present application, the metal layer of the encapsulation film may be transparent and opaque. The metal layer may have a thickness in a range of 3 μm to 200 μm, 10 μm to 100 μm, 20 μm to 90 μm, 30 μm to 80 μm, or 40 μm to 75 μm. The present application can provide a thin film encapsulation film while realizing sufficient heat release effect by controlling the thickness of the metal layer. The metal layer may be a thin metal foil or a polymer base layer deposited with metal. The metal layer is not particularly limited as long as it is a material satisfying the above-described thermal conductivity and containing a metal. The metal layer may comprise any one from a metal, a metal oxide, a metal nitride, a metal carbide, a metal oxynitride, a metal oxyboride, and a formulation thereof. For example, the metal layer may comprise an alloy in which one or more metal elements or nonmetal elements are added to one metal, and may comprise, for example, stainless steel (SUS). In addition, in one embodiment, the metal layer may comprise iron, chromium, copper, aluminum, nickel, iron oxide, chromium oxide, silicon oxide, aluminum oxide, titanium oxide, indium oxide, tin oxide, indium tin oxide, tantalum oxide, zirconium oxide, niobium oxide and a formulation thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one embodiment of the present application, the metal layer may be deposited by reactive sputtering.

Conventionally, a nickel-iron alloy (Invar) was usually used as an encapsulation film, but the nickel-iron alloy has a disadvantage that its price is high, its thermal conductivity is low, and its cutting property is poor. The present application provides an encapsulation film that prevents generation of bright spots of organic electronic devices, has excellent heat release characteristics, and implements process convenience due to magnetism, without using the nickel-iron alloy as the metal layer.

The encapsulation film may further comprise a base film or a release film (hereinafter, may be referred to as a "first film"), which may have a structure in which the encapsulation layer is formed on the base or release film. Also, the structure may further comprise a base or release film (hereinafter, may be referred to as a "second film") formed on the metal layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment may be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In the present application, the thickness of the base film or release film (first film) as above is not particularly limited, which may be appropriately selected depending on the application to which it is applied. For example, in the present application, the thickness of the first film may be 10 μm to 500 μm, preferably, 20 μm to 200 μm or so. If the thickness is less than 10 μm, deformation of the base film may easily occur during the manufacturing process, whereas if it exceeds 500 μm, the economic efficiency is low.

The thickness of the encapsulation layer included in the encapsulation film of the present application is not particularly limited, which may be appropriately selected in accordance with the following conditions in consideration of the application to which the film is applied. The thickness of the encapsulation layer may be 5 μm to 200 μm, preferably, 5 μm to 100 μm or so. The thickness of the encapsulation layer may be the entire thickness of the multi-layered encapsulation layer. If the thickness of the encapsulation layer is less than 5 μm, sufficient moisture barrier ability cannot be exhibited, whereas if it exceeds 200 μm, it is difficult to secure processability, the thickness expansion due to moisture reactivity is large, so that the deposited film of the organic light emitting element may be damaged, and the economic efficiency is low.

The present application also relates to an organic electronic device. As shown in FIG. 2, the organic electronic device may comprise a substrate (21); an organic electronic element (22) formed on the substrate (21); and the above-described encapsulation film (12) for encapsulating the organic electronic element (22). The encapsulation film may encapsulate the entire surface, for example, all the upper part and the side surface, of the organic electronic element formed on the substrate. The encapsulation film may comprise an encapsulation layer including a pressure-sensitive adhesive composition or an adhesive composition in a cross-linked or cured state. Furthermore, the organic electronic device may be formed by sealing the encapsulation layer so as to contact the entire surface of the organic electronic element formed on the substrate. A cover substrate (13) may be formed on the encapsulation layer (12). The cover substrate (13) may be glass, a plastic film, or the aforementioned metal layer. In one embodiment, the cover substrate (13) may be integrally included with the encapsulation layer (12) to form an encapsulation film. In one embodiment, the encapsulation film of the present application may be a film with a multilayer structure comprising the encapsulation layer (12) and the metal layer (13) integrally.

In an embodiment of the present application, the organic electronic element may comprise a pair of electrodes, an organic layer containing at least a light emitting layer, and a passivation film. Specifically, the organic electronic element may comprise a first electrode layer, an organic layer formed on the first electrode layer and containing at least a light emitting layer, and a second electrode layer formed on the organic layer, and may comprise a passivation film for protecting the electrode on the second electrode layer and the organic layer. The first electrode layer may be a transparent electrode layer or a reflective electrode layer, and the second electrode layer may also be a transparent electrode layer or a reflective electrode layer. More specifically, the organic electronic element may comprise a transparent electrode layer formed on a substrate, an organic layer formed on the transparent electrode layer and containing at least a light emitting layer, and a reflective electrode layer formed on the organic layer.

Here, the organic electronic element may be, for example, an organic light emitting element.

The passivation film may comprise an inorganic film and an organic film. In one embodiment, the inorganic film may be one or more metal oxides or nitrides selected from the group consisting of Al, Zr, Ti, Hf, Ta, In, Sn, Zn and Si. The inorganic film may have a thickness of 0.01 μm to 50 μm or 0.1 μm to 20 μm or 1 μm to 10 μm. In one embodiment, the inorganic film of the present application may be an inorganic material containing no dopant, or may be an inorganic material containing a dopant. The dopant which can be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto. The organic film is distinguished from the organic layer containing at least a light emitting layer in that it does not include a light emitting layer, and may be an organic deposition layer containing an epoxy compound.

The inorganic film or the organic film may be formed by chemical vapor deposition (CVD). For example, as the inorganic film, silicon nitride (SiNx) may be used. In one embodiment, silicon nitride (SiNx) used as the inorganic film may be deposited to a thickness of 0.01 μm to 50 μm. In one embodiment, the organic film may have a thickness in a range of 2 μm to 20 μm, 2.5 μm to 15 μm, or 2.8 μm to 9 μm.

The present application also provides a method for manufacturing an organic electronic device. The manufacturing method may comprise a step of applying the above-described encapsulation film to a substrate, on which an organic electronic element is formed, so as to cover the organic electronic element. In addition, the manufacturing method may comprise a step of curing the encapsulation film. The curing step of the encapsulation film may mean curing of the encapsulation layer, which may proceed before or after the encapsulation film covers the organic electronic element.

In this specification, the term "curing" may mean that the pressure-sensitive adhesive composition of the present disclosure forms a cross-linked structure through heating or UV irradiation processes, and the like to be produced in the form of a pressure-sensitive adhesive. Alternatively, it may mean that the adhesive composition is solidified and attached as an adhesive.

Specifically, the organic electronic element may be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film is placed to cover the entire surface of the organic electronic element of the substrate subjected to the above process.

Advantageous Effects

The encapsulation film of the present application can be applied to sealing or encapsulation of an organic electronic device such as an OLED. The film allows forming a structure capable of blocking moisture or oxygen introduced into an organic electronic device from the outside, and can prevent occurrence of bright spots of the organic electronic device.

DESCRIPTION OF REFERENCE NUMERALS

Figure 1A:
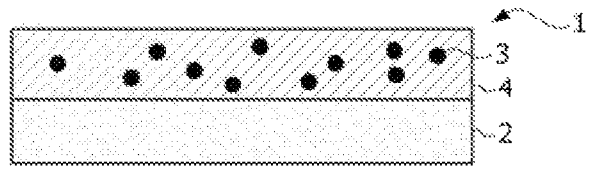
FIGS. 1A and 1B are each a cross-sectional diagram showing an encapsulation film according to one example of the present application.
Figure 1B:
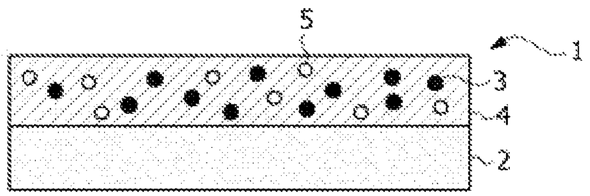
Figure 2:
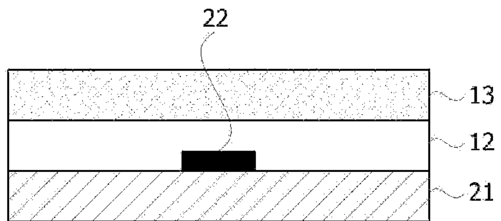
FIG. 2 is a cross-sectional diagram showing an organic electronic device according to one example of the present application.

1: encapsulation film
2, 4: encapsulation layer
3: bright spot inhibitor
5: moisture adsorbent
21: substrate
22: organic electronic element
12: encapsulation layer
13: metal layer

DETAILED DESCRIPTION

Hereinafter, the present disclosure will be described in more detail through examples according to the present disclosure and comparative examples not according to the present disclosure, but the scope of the present disclosure is not limited by the following examples.

Example 1

Production of Encapsulation Layer

To prepare a first layer solution, 250 kg of a butyl rubber resin (BR268, EXXON, solid content 20%) dissolved in toluene and 50 kg of a dicyclopentadiene hydrogenated resin (SU525, Kolon, solid content 70%) dissolved in toluene were homogenized. 15 kg of a multifunctional acrylate (trimethyrolpropane triacrylate, Miwon, solid content 50%) dissolved in toluene and 5 kg of a photoinitiator (Irgacure651, Ciba, solid content 20%) dissolved in toluene were introduced to the homogenized solution, and 15 kg of 2-(2-ethoxyethoxy)ethyl acrylate and 137 kg of toluene as an additional solvent were introduced thereto, homogenized and then stirred at high speed for 1 hour to prepare a first layer solution.

To prepare a second layer solution, 265 kg of a butyl rubber resin (BR268, EXXON, solid content 20%) dissolved in toluene and 67 kg of a dicyclopentadiene hydrogenated resin (SU525, Kolon, solid content 70%) dissolved in toluene and 3 kg of nickel (average particle diameter 500 nm) as a bright spot inhibitor were homogenized. 16 kg of a multifunctional acrylate (trimethyrolpropane triacrylate, Miwon, solid content 50%) dissolved in toluene and 8 kg of a photoinitiator (Irgacure651, Ciba, solid content 20%) dissolved in toluene were introduced to the homogenized solution, and 288 kg of a calcium oxide (CaO, raw material average particle diameter 2 μm) solution (solid content 50%) dispersed in toluene was introduced thereto. 66 kg of toluene was introduced to the solution, homogenized and then stirred at high speed for 1 hour to prepare a second layer solution.

After filtering the encapsulation layer solutions as prepared above through a 400-mesh nylon filter, the first layer (thickness 10 μm) and the second layer (thickness 50 μm) were each separately applied to the release surface of the release PET using a lip coater, were each dried in a dryer at 110° C. for 2 minutes and 4 minutes, and were each irradiated with ultraviolet rays at 0.8 and 2 J/cm$^2$ to form encapsulation layers, and then the two layers were laminated. The thickness means the thickness after drying is completed.

Production of Encapsulation Film

On the metal layer (SUS430, thickness 80 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to a size of 65 inches to produce a film for encapsulating an organic electronic element in a sheet state. Physical properties of the produced film are measured.

Example 2

A film for encapsulating an organic electronic element was produced in the same manner as in Example 1, except that the content of the CaO particles was changed to 290 kg.

Example 3

A film for encapsulating an organic electronic element was produced in the same manner as in Example 1, except that the average particle diameter of the CaO particles was changed to 2.5 μm.

Example 4

A film for encapsulating an organic electronic element was produced in the same manner as in Example 1, except that the average particle diameter of the CaO particles was changed to 1.5 μm.

Example 5

A film for encapsulating an organic electronic element was produced in the same manner as in Example 1, except that the average particle diameter of the Ni particles was changed to 600 nm.

Comparative Example 1

A film for encapsulating an organic electronic element was produced in the same manner as in Example 1, except that the average particle diameter of the CaO particles was changed to 6 μm.

Comparative Example 2

A film for encapsulating an organic electronic element was produced in the same manner as in Example 1, except that the average particle diameter of the Ni particles was changed to 2 μm.

Comparative Example 3

A film for encapsulating an organic electronic element was produced in the same manner as in Example 1, except that the content of CaO particles was changed to 1 kg.

Experimental Example 1—Calculation of Adsorption Energy

The adsorption energy of the bright spot inhibitors used in the examples and comparative examples for outgases was calculated through electronic structure calculation based on the density functional theory. After making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/Å or less. A series of calculation was performed through VASP as a commercially available code. The adsorption energies of Ni, which was the bright spot inhibitor used in Examples and Comparative Examples, to $NH_3$ and H were −0.54 and −2.624, respectively.

Experimental Example 2-Particle Size Distribution Result

For the encapsulation films produced in Examples, the encapsulation layers are each cut into 1.5 cm×1.5 cm, prepared as a sample, and then dissolved in 3 g of toluene (sonication 20 min, 50° C.). After filtering it through a 300-mesh nylon filter, the particle size of the solution passing through the filter is measured. In the particle size measurement method, Mastersizer (Malvern Panalytical Ltd) was used as a device to which a technology certified by ISO 13320: 2009 was applied. In the set-up on the software, the particle type is input into non-sphere, and then the solvent is input into toluene and the level sensor threshold is input into 20. Thereafter, the background measurement time and the sample measurement time are input into 10 seconds and 5 seconds, respectively, and the lower and upper limits of the measurement obscuration are input into 1% and 20%, respectively, and then the measurement is input so as to be performed at least 3 times, thereby completing the set-up. After introducing the toluene solvent to the device and circulating it at 2000 to 3000 RPM, initialization and background numerical measurement were performed, and the filtered dispersion solution of the bright spot inhibitor and the moisture adsorbent was introduced thereto, and the obscuration value on the software screen was set to be in 3 to 7% and then the measurement was performed. During the measurement process, peaks appearing as irregular frequencies and signals in the region with a particle diameter of 30 μm or more were determined as noises caused by dust and the like, and removed, and then the result values were derived.

A value according to the following general formula 1 was calculated. The unit of the average particle diameter is μm.

$$\sqrt{1.8\times D50+\frac{D50}{D10}+\frac{D90}{D50}}$$ [General Formula 1]

TABLE 1

| | | Dx(10) | Dx(50) | Dx(90) | Dx(99) | General Formula 1 |
|---|---|---|---|---|---|---|
| Example | 1 | 0.7 | 2.04 | 4.12 | 5.62 | 2.93 |
| | 2 | 0.767 | 2.08 | 4.15 | 5.63 | 2.91 |
| | 3 | 0.991 | 2.79 | 6.6 | 10.7 | 3.19 |
| | 4 | 0.835 | 1.87 | 3.36 | 4.52 | 2.72 |
| | 5 | 0.942 | 2.87 | 5.47 | 7.53 | 3.18 |
| Comparative Example | 1 | 1.53 | 4.72 | 10.9 | 18 | 3.73 |
| | 2 | 2.77 | 9.24 | 16.2 | 30.4 | 4.66 |
| | 3 | 0.564 | 0.968 | 1.66 | 2.35 | 2.27 |

Experimental Example 3-Panel Defect Measurement

After depositing an organic electronic element on a thin film transistor glass substrate, the encapsulation films produced in Examples and Comparative Examples were each laminated on the element using a vacuum bonding machine under conditions of 25° C., a vacuum degree of 50 mtorr and 0.4 MPa to have an effective bezel length of 3 to 4 mm, thereby manufacturing an organic electronic panel with a size of 65 inches. The effective bezel means the distance between the outer side and the inner side of the edge region where the encapsulation layer directly meets the glass substrate without the organic electronic element on the edge of the glass substrate. After driving the manufactured panel at 85° C. and 85% relative humidity for 1000 hours, it was turned on in a dark room and it was confirmed with the naked eye whether or not defective pixels occurred. As for the defective pixels, bright points brighter than the periphery or dark points darker than the periphery were determined as defective pixels. In the case of 3 or less defective pixels, it was classified as O; in the case of less than 10 defective pixels, it was classified as Δ; and when 10 or more defective pixels occurred, it was classified as X.

Experimental Example 4-Moisture Barrier Length Measurement

As the length of moisture penetration in the edge region of the panel that the measurement of Experimental Example 3 was completed, the distance between the outer side and the inner side of the region where the transparency was increased was measured. With regard to the moisture adsorbent, the region where as the transparency was increased due to the reaction with moisture, moisture penetrated and the region where moisture did not penetrate were divided by a boundary point of the difference in transparency. When the moisture barrier distance was 2 mm or less, it was classified as O, and when the high-temperature and high-humidity endurance reliability was not good because it exceeded 2 mm, it was classified as X.

In case of poor durability (cure degree) upon high-temperature and high-humidity evaluation, the moisture barrier distance is deteriorated. Therefore, the moisture barrier distance can be a measure of durability and hardening.

TABLE 2

| | | Panel Defect | Moisture Barrier Properties |
|---|---|---|---|
| Example | 1 | O | O |
| | 2 | O | O |
| | 3 | O | O |
| | 4 | O | O |
| | 5 | O | O |
| Comparative Example | 1 | O | X |
| | 2 | O | X |
| | 3 | O | X |

The invention claimed is:

1. An encapsulation film comprising an encapsulation layer which comprises a moisture adsorbent, a bright spot inhibitor and an encapsulation resin, wherein a value of the following General Formula 1 is in a range from 2.4 to 3.6 according to a particle size analysis of the moisture adsorbent and the bright spot inhibitor contained in a sample provided by dissolving the encapsulation layer in an organic solvent to form a solution and then filtering the solution through a 300-mesh nylon filter, and wherein the bright spot inhibitor has an adsorption energy of 0 eV or less for outgases as calculated by an approximation method of density functional theory, wherein the bright spot inhibitor comprises at least one selected from the group consisting of nickel, nickel oxide, and a magnesium-nickel alloy, and the moisture adsorbent comprises at least one selected from the group consisting of calcium oxide, magnesium oxide, and barium oxide, wherein when an entire surface or a cross-section of the encapsulation layer is viewed with a backscattered electron image at an acceleration voltage of 15k V through scanning electron microscope, an area of the moisture adsorbent and the bright spot inhibitor having a particle diameter of 100 nm to 20 μm is in a range of 20% or more and 70% or less of an area of all exposed surfaces of the encapsulation layer or the cross-section of the encapsulation layer, and the area occupied by the bright spot inhibitor is smaller than the area occupied by the moisture adsorbent, and wherein a ratio of D50 of the bright spot inhibitor to D50 of the moisture adsorbent is in a range of 0.15 or more to 2.0 or less:

$$\sqrt{1.8 \times D50 + \frac{D50}{D10} + \frac{D90}{D50}} \quad \text{General Formula 1}$$

wherein, D10 is a particle diameter corresponding to the volume accumulation 10% in the cumulative distribution of particles, D50 is a particle diameter corresponding to the volume accumulation 50% in the cumulative distribution of particles, D90 is a particle diameter corresponding to the volume accumulation 90% in the cumulative distribution of particles, and the unit for D10, D50, and D90 is μm, where the particle size analysis is a particle size distribution measured according to ISO13320:2009.

2. The encapsulation film according to claim 1, wherein the moisture adsorbent has a particle diameter in a range of 100 to 15000 nm.

3. The encapsulation film according to claim 1, wherein the bright spot inhibitor has a particle diameter in a range of 10 nm to 30 μm.

4. The encapsulation film according to claim 1, wherein the outgas comprises oxygen, H atoms, $H_2$ molecules or $NH_3$.

5. The encapsulation film according to claim 1, wherein the moisture adsorbent comprises a chemically reactive adsorbent.

6. The encapsulation film according to claim 1, wherein the moisture adsorbent is comprised in a range of 5 to 250 parts by weight relative to 100 parts by weight of the encapsulation resin.

7. The encapsulation film according to claim 1, wherein the bright spot inhibitor is comprised in an amount of 1 to 150 parts by weight relative to 100 parts by weight of the encapsulation resin.

8. The encapsulation film according to claim 1, wherein the encapsulation resin is a curable resin or a crosslinkable resin.

9. The encapsulation film according to claim 1, wherein the encapsulation layer further comprises a tackifier.

10. The encapsulation film according to claim 1, wherein the encapsulation layer further comprises an active energy ray polymerizable compound.

11. The encapsulation film according to claim 1, wherein the encapsulation layer encapsulates the entire surface of an organic electronic element formed on a substrate.

12. The encapsulation film according to claim 1, further comprising a metal layer formed on one surface of the encapsulation layer.

13. An organic electronic device comprising a substrate; an organic electronic element formed on a substrate; and the encapsulation film according to claim 1 encapsulating the organic electronic element.

14. The organic electronic device according to claim 13, wherein the organic electronic element comprises a pair of electrodes, an organic layer containing at least a light emitting layer, and a passivation film.

15. A method for manufacturing an organic electronic device comprising a step of applying the encapsulation film according to claim 1 to a substrate, on which an organic electronic element is formed, so as to cover the organic electronic element.

16. An encapsulation film comprising an encapsulation layer which comprises a moisture adsorbent, a bright spot inhibitor and an encapsulation resin, wherein a value of the following General Formula 1 is in a range from 2.4 to 3.6 according to a particle size analysis of the moisture adsorbent and the bright spot inhibitor contained in a sample provided by dissolving the encapsulation layer in an organic solvent to form a solution and then filtering the solution through a 300-mesh nylon filter, wherein the bright spot inhibitor has an adsorption energy of 0 eV or less for outgases, as calculated by an approximation method of density functional theory, wherein the bright spot inhibitor comprises nickel particles and the moisture adsorbent comprises calcium oxide, wherein when an entire surface or a cross-section of the encapsulation layer is viewed with a backscattered electron image at an acceleration voltage of 15k V through scanning electron microscope, an area of the moisture adsorbent and the bright spot inhibitor having a particle diameter of 100 nm to 20 μm is in a range of 20% or more and 70% or less of an area of all exposed surfaces of the encapsulation layer or the cross-section of the encapsulation layer and the area occupied by the bright spot inhibitor is smaller than the area occupied by the moisture adsorbent, and wherein a ratio of D50 of the bright spot inhibitor to D50 of the moisture adsorbent is in a range of 0.15 or more to 2.0 or less:

$$\sqrt{1.8 \times D50 + \frac{D50}{D10} + \frac{D90}{D50}}$$ General Formula 1 wherein, D10 is a particle diameter corresponding to the volume accumulation 10% in the cumulative distribution of particles, D50 is a particle diameter corresponding to the volume accumulation 50% in the cumulative distribution of particles, D90 is a particle diameter corresponding to the volume accumulation 90% in the cumulative distribution of particles, and the unit for D10, D50, and D90 is μm, where the particle size analysis is a particle size distribution measured according to ISO13320:2009.

* * * * *